United States Patent
Yan et al.

(10) Patent No.: US 8,878,226 B2
(45) Date of Patent: Nov. 4, 2014

(54) LIGHT EMITTING DEVICE

(71) Applicant: Industrial Technology Research Institute, Hsinchu (TW)

(72) Inventors: Jing-Yi Yan, Zhubei (TW); Shu-Tang Yeh, Tanzih Township (TW); Chih-Chieh Hsu, Hsinchu (TW); Chen-Wei Lin, Kaohsiung (TW); Kuang-Jung Chen, Zhubei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 13/744,207

(22) Filed: Jan. 17, 2013

(65) Prior Publication Data
US 2013/0187135 A1 Jul. 25, 2013

(30) Foreign Application Priority Data
Jan. 20, 2012 (TW) .............................. 101102437 A

(51) Int. Cl.
*H01L 33/00* (2010.01)
*H01L 51/52* (2006.01)
*H01L 27/32* (2006.01)

(52) U.S. Cl.
CPC ........ *H01L 51/5228* (2013.01); *H01L 27/3244* (2013.01)
USPC .................................. 257/99; 257/88; 257/91

(58) Field of Classification Search
None
See application file for complete search history.

(56) References Cited

U.S. PATENT DOCUMENTS

| | | | |
|---|---|---|---|
| 6,191,433 B1 | 2/2001 | Roitman et al. | |
| 6,407,408 B1 * | 6/2002 | Zhou et al. | 257/40 |
| 6,784,009 B2 | 8/2004 | Lim et al. | |
| 6,876,007 B2 * | 4/2005 | Yamazaki et al. | 257/88 |
| 7,034,457 B2 * | 4/2006 | Iwase et al. | 313/512 |
| 7,187,117 B2 | 3/2007 | Lu | |

(Continued)

FOREIGN PATENT DOCUMENTS

| | | |
|---|---|---|
| TW | 200601884 A | 1/2006 |
| TW | I252446 | 4/2006 |
| TW | I273701 B | 2/2007 |
| TW | I274525 | 2/2007 |

OTHER PUBLICATIONS

Chen et al., "An effective cathode structure for inverted top-emitting organic light-emitting devices", Applied Physics Letters, vol. 85 No. 13, pp. 2469-2471, Sep. 27, 2004.

(Continued)

*Primary Examiner* — Tan N Tran
*Assistant Examiner* — Scott R Wilson
(74) *Attorney, Agent, or Firm* — Birch, Stewart, Kolasch & Birch, LLP

(57) ABSTRACT

A light emitting device includes a substrate, and a plurality of light emitting structures disposed thereon. Each of the light emitting structures includes an auxiliary electrode disposed on the substrate, a first insulating layer disposed on the substrate and covering the auxiliary electrode, an electrode disposed on the first insulating layer, a second insulating layer disposed on the first insulating layer and having a first opening exposing the electrode, an organic light emitting layer disposed in the first opening, a cathode disposed on the organic light emitting layer, at least a conductive structure penetrating through the first insulating layer and the second insulating layer, and a closed ring structure disposed on the second insulating layer and around the cathode, wherein a thickness of the closed ring structure is larger than that of the cathode.

21 Claims, 11 Drawing Sheets

(56) References Cited

U.S. PATENT DOCUMENTS

| | | | |
|---|---|---|---|
| 7,662,426 B2 | 2/2010 | Cheng et al. | |
| 2002/0167280 A1* | 11/2002 | Hayashi et al. | 315/169.3 |
| 2003/0096446 A1* | 5/2003 | Lim et al. | 438/99 |
| 2006/0028124 A1 | 2/2006 | Chu et al. | |
| 2007/0194699 A1* | 8/2007 | Lee et al. | 313/505 |
| 2008/0067929 A1 | 3/2008 | Kuo | |
| 2008/0287028 A1* | 11/2008 | Ozawa | 445/24 |
| 2009/0021134 A1* | 1/2009 | Matsudate et al. | 313/326 |

OTHER PUBLICATIONS

Duggal et al., "Organic light-emitting devices for illumination quality white light", Applied Physics Letters vol. 80, No. 19, pp. 3470-3472, May 13, 2002.

Han et al., "Transparent-cathode for top-emission organic light-emitting diodes" Applied Physics Letters, vol. 82, No. 16, pp. 2715-2717, Apr. 21, 2003.

Liu et al., "Efficiency enhancement of an organic light-emitting diode with a cathode forming two-dimensional periodic hole array", Applied Physics Letters, vol. 86, pp. 143501-1-143501-3, (2005).

Reineke et al., "White organic light-emitting diodes with fluorescent tube efficiency", Nature, vol. 459, pp. 234-239, May 14, 2009.

Yang et al., "High-contrast top-emitting organic light-emitting devices for active-matrix displays", Applied Physics Letters, vol. 87, pp. 143507-1-143507-3, (2005).

TW Office Action dated Aug. 20, 2014. pp. 1-7.

* cited by examiner

LIGHT EMITTING DEVICE

CROSS REFERENCE TO RELATED APPLICATIONS

This Application claims priority of Taiwan Patent Application No. 101102437, filed on Jan. 20, 2012, the entirety of which is incorporated by reference herein.

TECHNICAL FIELD

The present disclosure relates to a device, and in particular, relates to a light emitting device.

BACKGROUND

Since organic light emitting diodes have many advantages, such as being lightweight and thin, and having self-light emitting, wide viewing angle, high resolution, high brightness, low power consumption, and high response speed characteristics, they are extensively applied in the flat-panel display field. An organic light emitting diode basically includes a cathode, an anode, and an organic layer sandwiched therebetween.

In related art, a plurality of organic light emitting diodes of an organic light emitting diode display share a common cathode. As the organic light emitting diodes are applied to large-sized displays, the common cathode has a large area accordingly. Thus, portions of the common cathode, in different locations, have very different resistances, which cause voltage drops, which influence the display uniformity of the conventional large-sized display. Furthermore, because the common cathode has a large area, a large driving current is needed to be applied to the common cathode to drive the organic light emitting diodes. Requirement for large currents may shorten the lifespan of an electronic device.

SUMMARY

An embodiment of the disclosure provides a light emitting device which includes: a substrate; and plurality of light emitting structures on the substrate, wherein each of the light emitting structures comprises: an auxiliary electrode disposed on the substrate, wherein the auxiliary electrode is suitable to be used as a cathode; a first insulating layer disposed on the substrate and covering the auxiliary electrode; a first electrode disposed on the first insulating layer, wherein the first electrode is suitable to be used as an anode; a second insulating layer disposed on the first insulating layer and having a first opening which exposes the first electrode; a first organic light-emitting layer disposed in the first opening to connect the first electrode; a cathode disposed on the first organic light-emitting layer; at least a conductive structure passing through the first insulating layer and the second insulating layer and connecting the cathode to the auxiliary electrode; and a patterned structure layer disposed on the second insulating layer and around the cathode, wherein a thickness of the patterned structure layer is larger than that of the cathode. The geometric of patterned structure layer could be square, rectangular, circular or any other suitable geometric in a top view.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings, wherein.

DETAILED DESCRIPTION OF DISCLOSED EMBODIMENTS

The following description is made for the purpose of illustrating the general principles of the disclosure and should not be taken in a limiting sense.

It is understood, that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

Figure 1A:
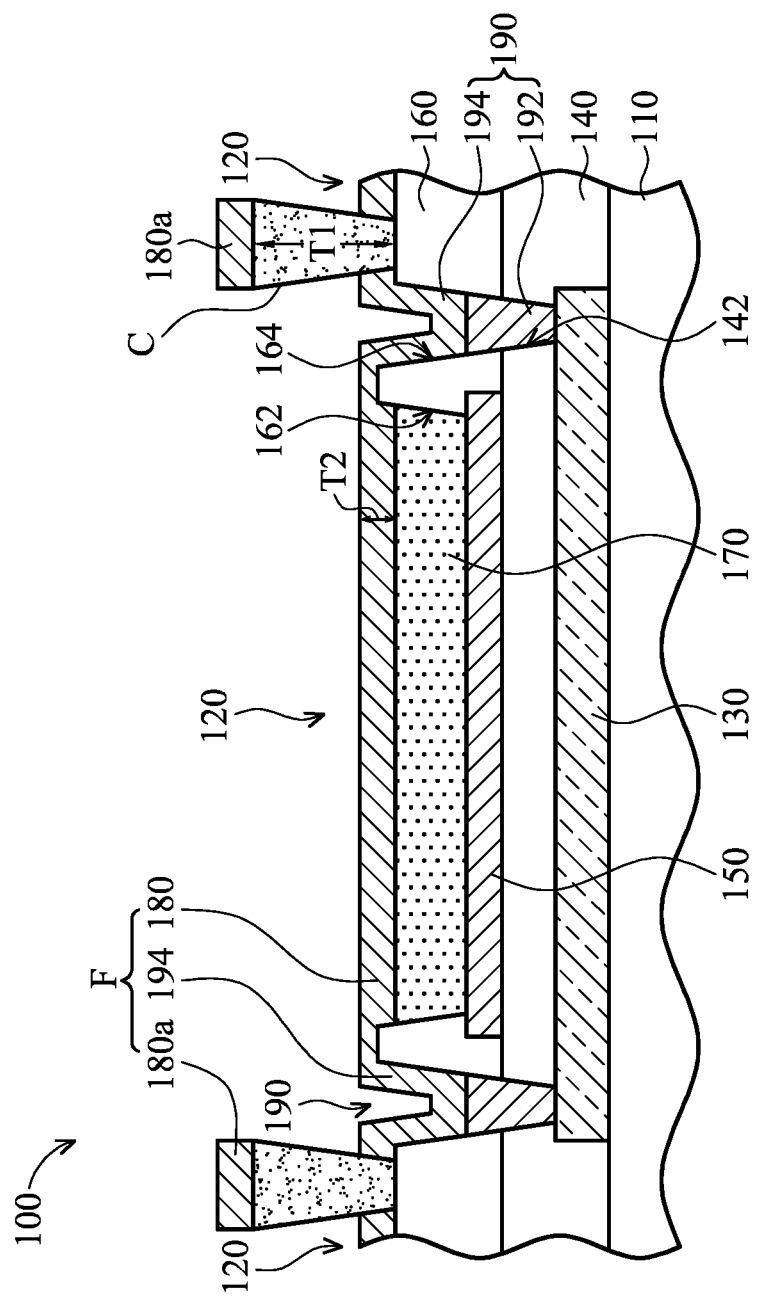
FIG. 1A is a cross-sectional view of a light emitting device according to an embodiment of the present disclosure.
Figure 1B:
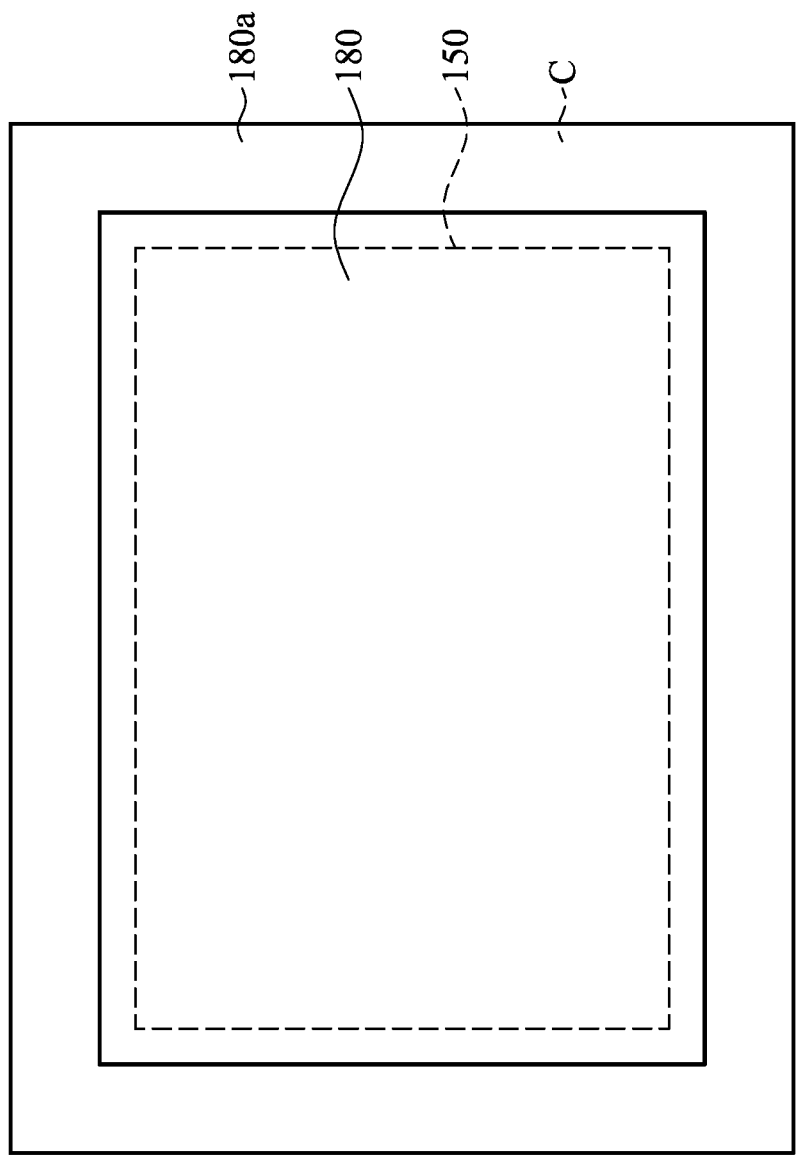
FIG. 1B is a top view of FIG. 1A.

FIG. 1A is a cross-sectional view of a light emitting device according to an embodiment of the present disclosure, and FIG. 1B is a top view of FIG. 1A. Referring to FIGS. 1A and 1B, the light emitting device 100 of the present embodiment includes a substrate 110 and a plurality of light emitting structures 120 disposed thereon, wherein each of the light emitting structures 120 includes an auxiliary electrode 130, a first insulating layer 140, a first electrode 150, a second insulating layer 160, a first organic light-emitting layer 170, a cathode 180, a plurality of conductive structures 190, and a patterned structure layer C.

The auxiliary electrode 130 is disposed on the substrate 110 and is suitable to be used as a cathode. The auxiliary electrode 130 may include indium tin oxides, indium zinc oxides, or other materials with high conductivities. In one embodiment, the auxiliary electrode 130 is located directly below the first electrode 150.

The first insulating layer 140 is disposed on the substrate 110 and covers the auxiliary electrode 130. The first electrode 150 is disposed on the first insulating layer 140 and is suitable to be used as an anode. The second insulating layer 160 is disposed on the first insulating layer 140, and has a first opening 162 which exposes the first electrode 150. The first organic light-emitting layer 170 is disposed in the first opening 162 to connect to the first electrode 150.

The cathode 180 is disposed on the first organic light-emitting layer 170. The cathode 180 may include, for example, aluminum, silver, or other materials with high conductivities. In one embodiment, a conductive layer 180a is disposed on the patterned structure layer C, and the conductive layer 180a and the cathode 180 are formed during the same deposition process and thus are formed of the same materials.

The conductive structure 190 passes through the first insulating layer 140 and the second insulating layer 160, and connects the cathode 180 to the auxiliary electrode 130. Specifically, in one embodiment, the first insulating layer 140 has a plurality of first through holes 142, and the second insulating layer 160 has a plurality of second through holes 164 correspondingly connecting to the first through holes 142. The conductive structure 190 has a first conductive plug 192 in the first through hole 142 and a second conductive plug 194 in the second through hole 164. In one embodiment, the first conductive plug 192 and the first electrode 150 are formed during the same deposition process, and the second conductive plug 194 and the cathode 180 are formed during the same deposition process.

The patterned structure layer C is disposed on the second insulating layer 160 and is around the cathode 180 (or the patterned structure layer C surrounds the cathode 180), wherein the patterned structure layer C has a thickness T1 larger than the thickness T2 of the cathode 180. In one embodiment, the patterned structure layer C may be a closed-ring structure, when viewed from a top view. In one embodiment, the patterned structure layer C is in an inverted trapezoid shape, when viewed from the cross sectional view. The patterned structure layer C includes photosensitive organic materials. In other embodiments, the patterned structure layer C may be in a square shape or other suitable shapes, when viewed from the cross sectional view. For example, the geometric of patterned structure layer could be square, rectangular, circular and any other suitable geometric in a top view.

It should be noted that, in the light emitting structures 120 of the present embodiment, the cathodes 180 of the light emitting structures 120 are isolated from each other by the patterned structure layers C. Each of the cathodes 180 is electrically connected to a corresponding auxiliary electrode 130, so a voltage (or a current) may be applied to each of the cathodes 180 through the corresponding auxiliary electrode 130. In other words, in the present embodiment, the conventional large-sized common cathode is replaced by the isolated small-sized cathodes 180 and the auxiliary electrodes 130 connected to the isolated small-sized cathodes 180. Therefore, the present embodiment may effectively reduce the size (i.e. the area) of each of the cathodes 180, which resolves the problems associated with voltage drop and the need for a large driving current due to the conventional cathode having a large area, thereby improving the performance of displays and the lifespan of electronic devices.

In one embodiment, the light emitting device 100 is a bottom emitting type light emitting device, wherein the auxiliary electrode 130 and the first electrode 150 include, for example, transparent conductive materials, such as indium tin oxides, or indium zinc oxides.

In another embodiment, the light emitting device 100 is a double-side emitting type light emitting device, wherein the auxiliary electrode 130, the first electrode 150, and the cathode 180 are transparent films. The cathode 180 may be a conductive film with a small thickness (about 100 Å), wherein the cathode 180 includes aluminum or silver.

In still another embodiment, the light emitting device 100 is a top emitting type light emitting device, wherein the cathode 180 is a transparent film, and the electrode 150 and/or 130 includes, for example, high reflectivity materials, such as silver or aluminum.

The manufacturing method of the light emitting device 100 of the present embodiment is described as follows.

Figure 2:
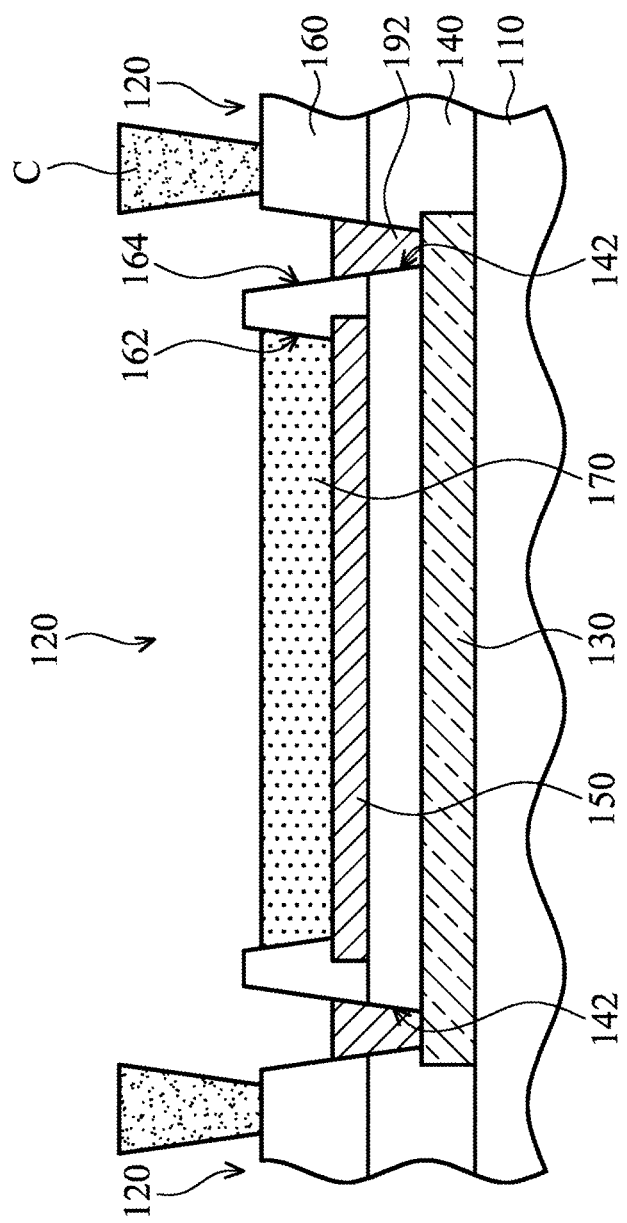
FIG. 2 is a cross sectional view of the manufacturing process of a light emitting device in accordance with an embodiment of the present disclosure.

FIG. 2 is a cross sectional view of the manufacturing process of a light emitting device in accordance with an embodiment of the present disclosure. Referring to FIG. 2, the substrate 110 is firstly provided. Then, a plurality of light emitting structures 120 is formed on the substrate 110. Specifically, in one embodiment, the manufacturing method of each of the light emitting structures 120 may be described as follows. The auxiliary electrode 130 is formed on the substrate 110 by, for example, sputtering. Then, the first insulating layer 140 is formed on the substrate 110. Then, the first insulating layer 140 is patterned, such that the first insulating layer 140 has the first through holes 142 which expose the auxiliary electrode 130.

Then, a conductive layer (not shown) is formed on the first insulating layer 140, and the conductive layer extends into the first through holes 142. Then, the conductive layer is patterned to form the first electrode 150 and the first conductive plugs 192 in the first through holes 142. Then, the second insulating layer 160 is formed on the first insulating layer 140, and the second insulating layer 160 is patterned so as to form the first opening 162 which exposes the first electrode 150 and the second through holes 164 exposing the first conductive plugs 192. Then, the patterned structure layer C is formed on the second insulating layer 160 and is around the second through holes 164 and the first opening 162. Then, the first organic light-emitting layer 170 is formed in the first opening 162 by, for example, evaporation or ink-jet printing.

Then, referring to FIG. 1A, a film F is blanketly formed on the top surfaces of the first organic light-emitting layer 170, the second insulating layer 160, the first conductive plug 192, and the patterned structure layer C by, for example, evaporation. The film F includes the cathode 180 disposed on the first organic light-emitting layer 170, the second conductive plugs 194 disposed on the first conductive plug 192, and the conductive layer 180a disposed on the patterned structure layer C. In the present embodiment, the second conductive plugs 194 conformally cover the sidewalls and the bottoms of the second through holes 164. The thickness T1 of the patterned structure layer C is larger than the thickness T2 of the cathode 180 so as to separate the cathodes 180 of two neighboring light emitting structures 120 from each other.

Figure 3:
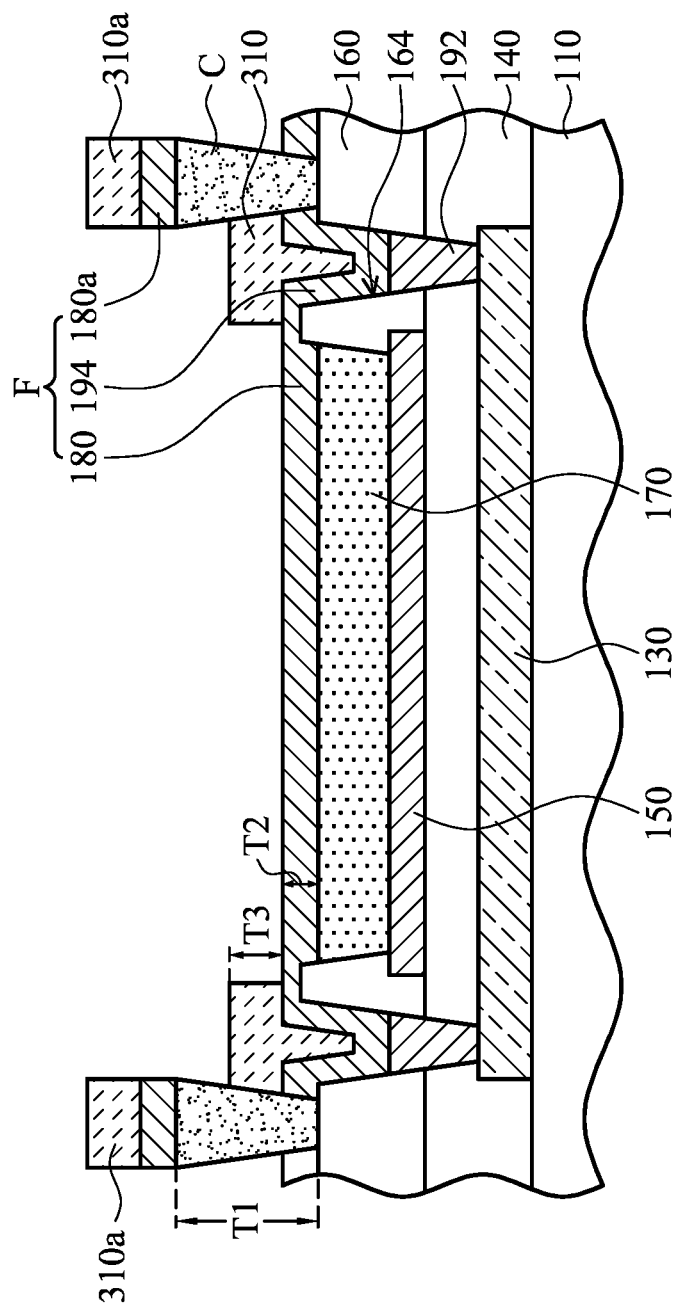
FIG. 3 is a cross sectional view of the manufacturing process of a light emitting device in accordance with an embodiment of the present disclosure.

FIG. 3 is a cross sectional view of the manufacturing process of a light emitting device in accordance with an embodiment of the present disclosure. Referring to FIG. 3, a thick metal layer 310 may be optionally deposited on the second conductive plugs 194 in the second through holes 164 after the formation of the film F, wherein the thickness T3 of the thick metal layer 310 is larger than the thickness T2 of the cathode 180. Furthermore, when the thick metal layer 310 is formed, a conductive layer 310a may be optionally deposited on the patterned structure layer C. The thickness T1 of the patterned structure layer C is larger than the thickness T3 of the thick metal layer 310 so as to separate the thick metal layer 310 from the conductive layer 310a.

Because the film F formed by evaporation is thin, the thick metal layer 310 formed on the second conductive plug 194 may ensure the quality of electrical connectivity between the auxiliary electrode 130 and the cathode 180, and mitigate the influence of poor coverage of the second conductive plug 194 of the film F. In the present embodiment, the thick metal layer 310 is disposed on the second conductive plug 194.

Figure 4:
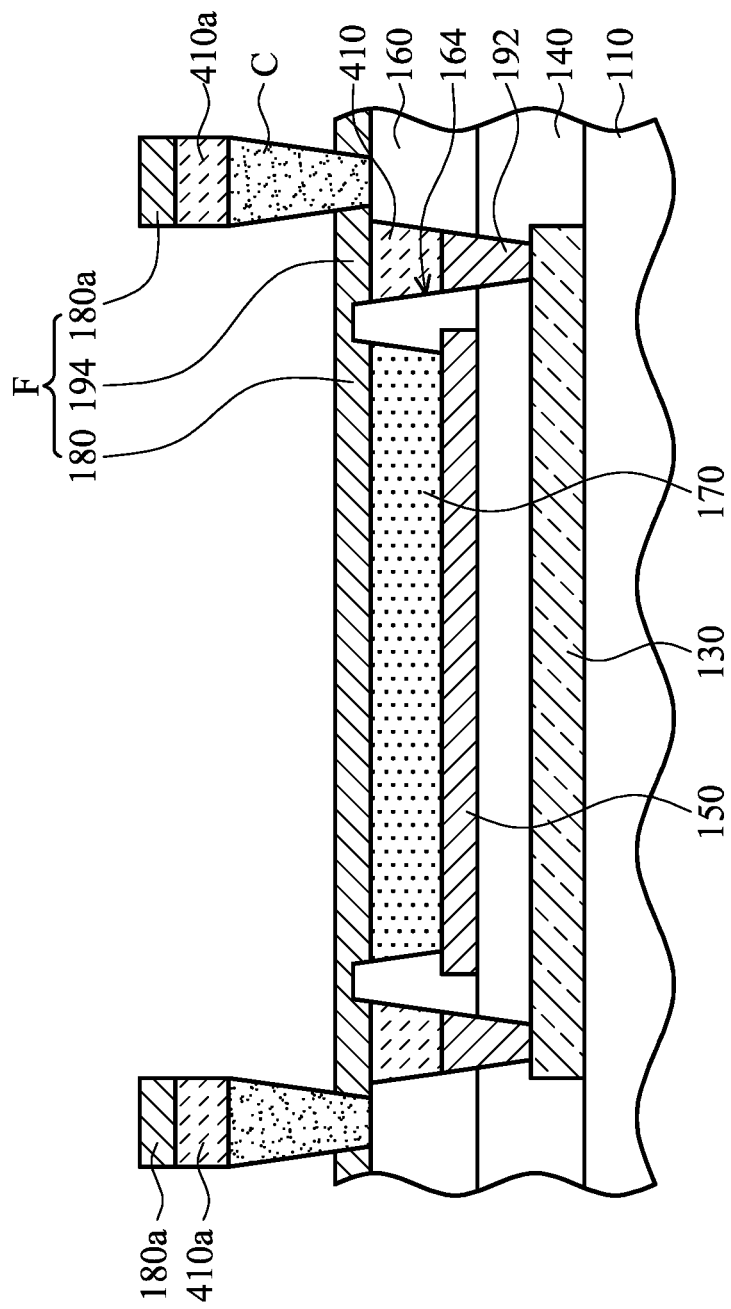
FIG. 4 is a cross sectional view of the manufacturing process of a light emitting device in accordance with another embodiment of the present disclosure.

FIG. 4 is a cross sectional view of the manufacturing process of a light emitting device in accordance with another embodiment of the present disclosure. Referring to FIG. 4, in another embodiment, before the formation of the second conductive plug 194, a thick metal layer 410 may be firstly formed in the second through holes 164, so the second conductive plugs 194 may be located on the thick metal layer 410. In one embodiment, the thick metal layer 410 may fill at least half of the second through hole 164. It is difficult for the film F to uniformly cover the second through hole 164 with a high aspect ratio (especially cover the inner wall of the through hole), so the aspect ratio may be reduced by firstly forming the thick metal layer 410 in the second through hole 164, which helps to form the film F with a uniform thickness in the second through hole 164 to improve the quality of the electrical connection between the cathode 180 and the auxiliary electrode 130.

Furthermore, when the thick metal layer 410 is formed, a conductive layer 410a may be optionally deposited on the patterned structure layer C. In this case, the conductive layer 180a formed during the same evaporation process as the cathode 180 may be formed on the conductive layer 410a.

Figure 5A:
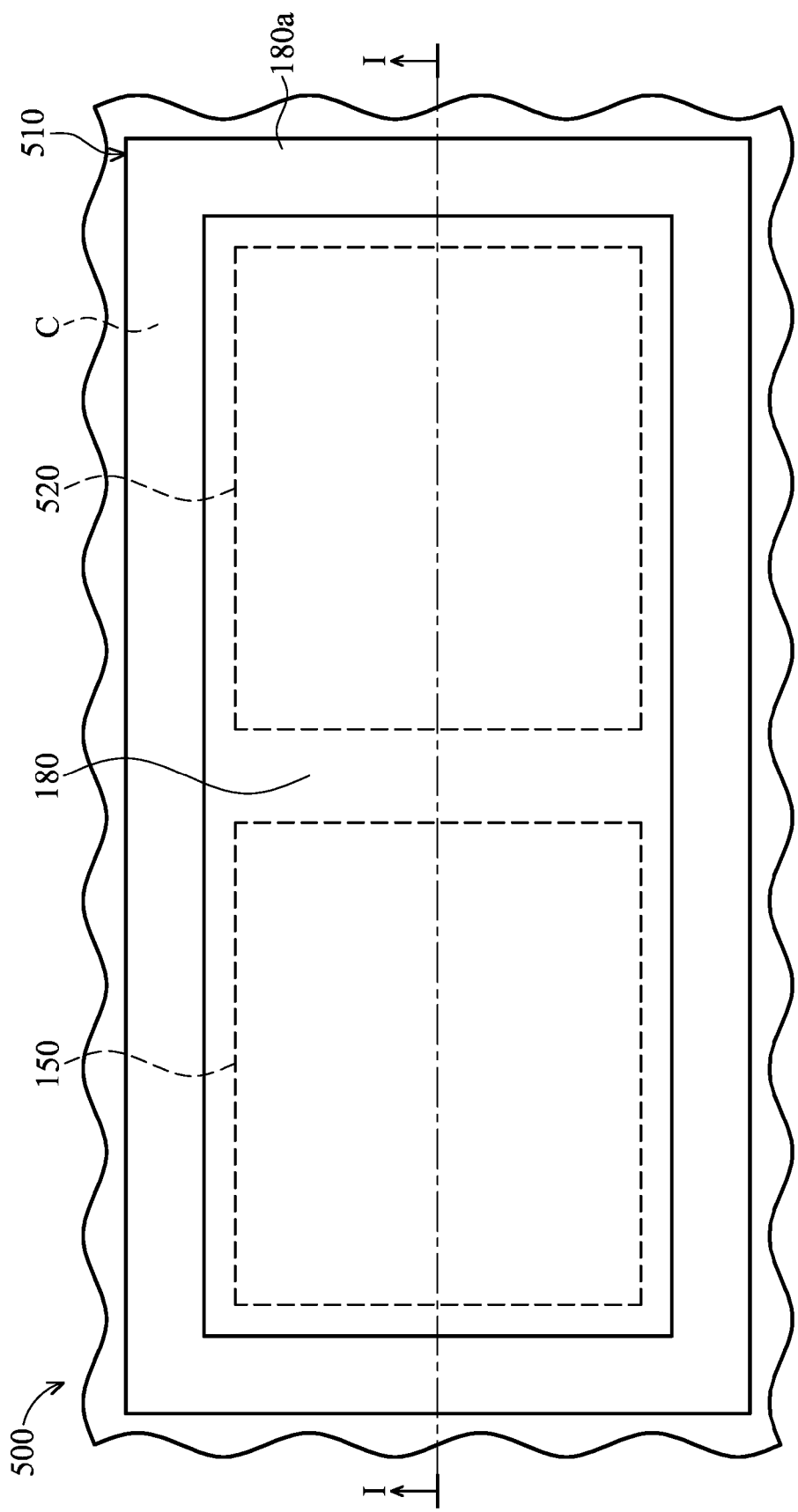
FIG. 5A is top view of a light emitting device in accordance with another embodiment of the present disclosure.
Figure 5B:
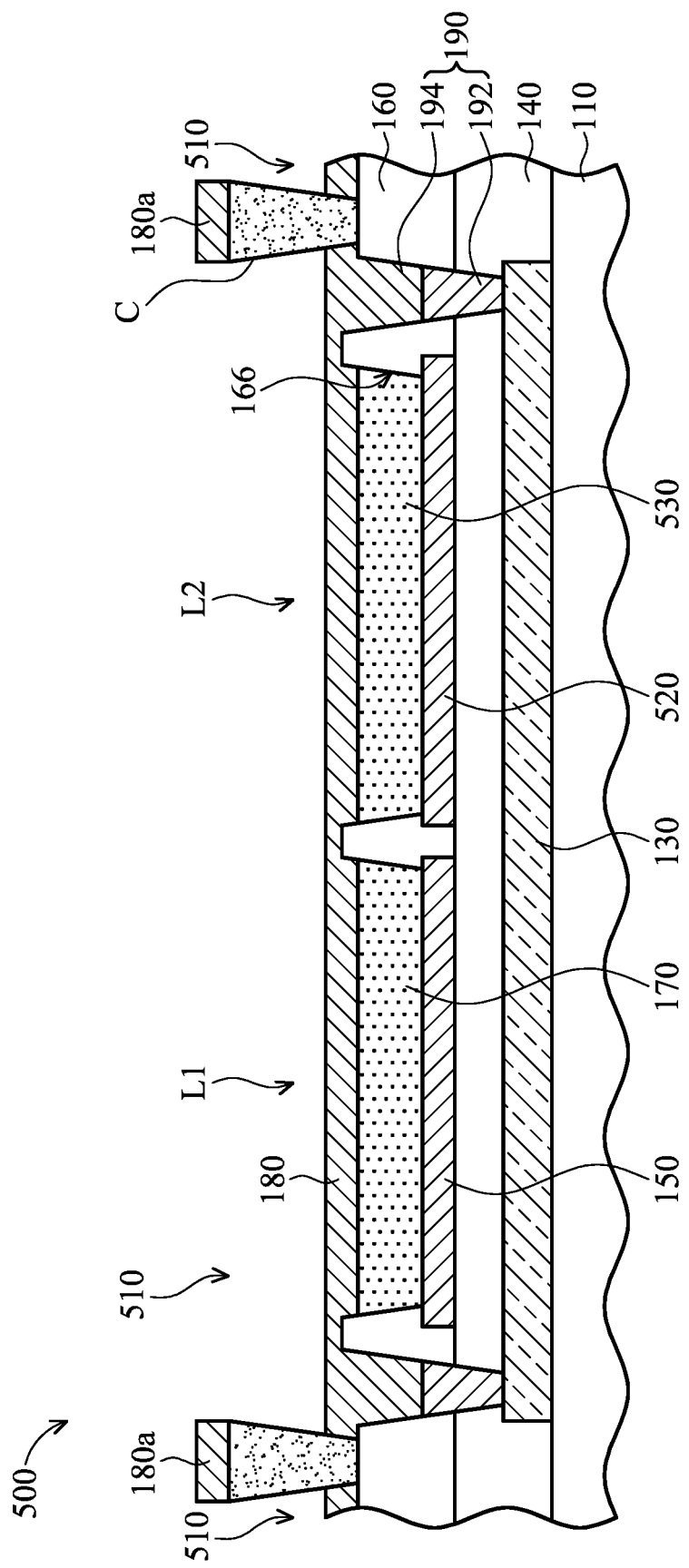
FIG. 5B is a cross sectional view of the light emitting device in FIG. 5A along a sectional line I-I.

FIG. 5A is top view of a light emitting device in accordance with another embodiment of the present disclosure. FIG. 5B is a cross sectional view of the light emitting device in FIG. 5A along a sectional line I-I. Referring to FIGS. 5A and 5B, the light emitting device 500 of the present embodiment is similar to the light emitting device 100 in FIG. 1A, except that the light emitting structure 510 of the light emitting device 500 of the present embodiment further includes a second electrode 520 and a second organic light-emitting layer 530.

Specifically, the second electrode 520 is disposed on the first insulating layer 140 and is separated from the first electrode 150. The second electrode 520 is suitable to be used as an anode, and the second insulating layer 160 further has a second opening 166 which exposes the second electrode 520. The second organic light-emitting layer 530 is disposed in the second opening 166 to connect the second electrode 520, and the cathode 180 is disposed on the second organic light-emitting layer 530.

In other words, the patterned structure layer C of the present embodiment is around a plurality of light emitting units (i.e. the first light emitting unit L1 and the second light emitting unit L2) sharing the cathode 180 but not sharing the electrode. The first light emitting unit L1 includes the first electrode 150, the first organic light-emitting layer 170, and the cathode 180, and the second light emitting unit L2 includes the second electrode 520, the second organic light-emitting layer 530, and the cathode 180. Because the first electrode 150 and the second electrode 520 are separated from each other, the first light emitting unit L1 and the second light emitting unit L2 may be controlled independently.

Figure 6:
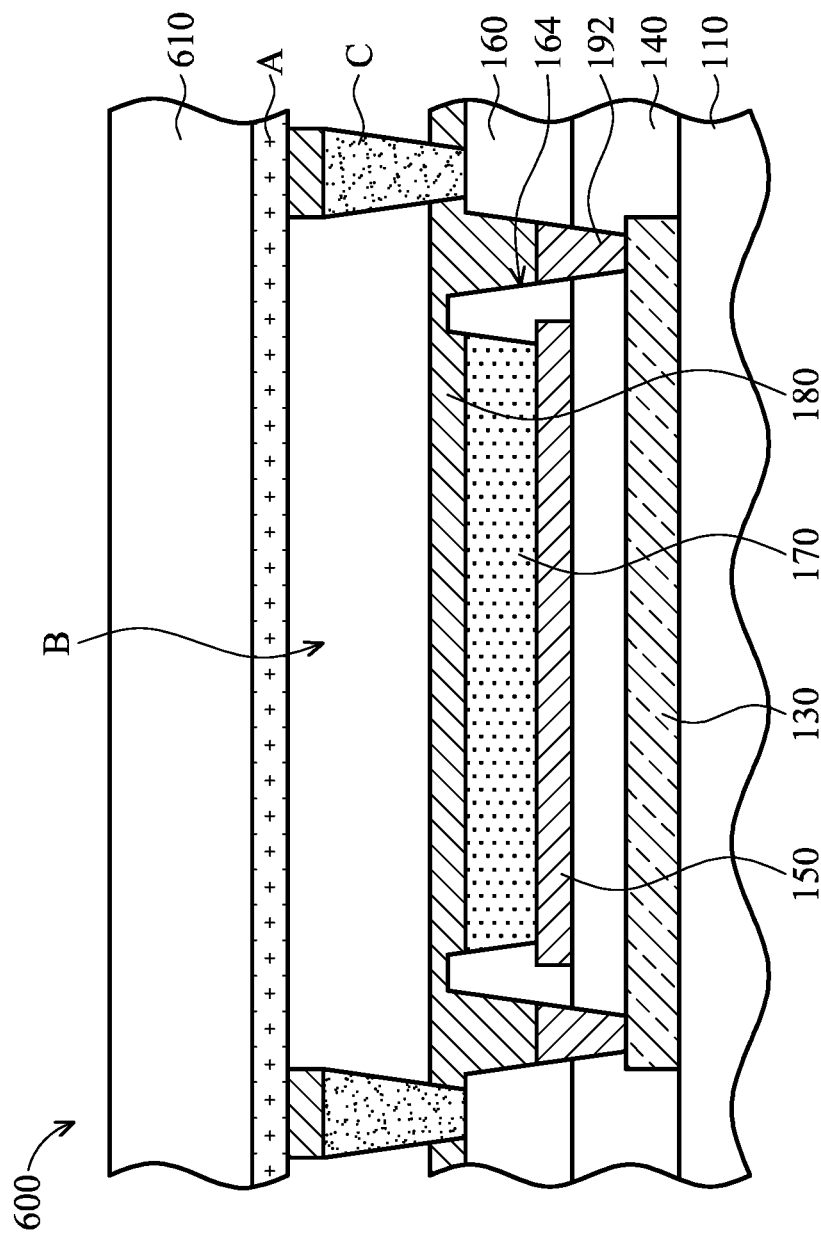
FIG. 6 is a cross-sectional view of a light emitting device according to another embodiment of the present disclosure.

FIG. 6 is a cross-sectional view of a light emitting device according to another embodiment of the present disclosure. Referring to FIG. 6, the light emitting device 600 of the present embodiment is similar to the light emitting device 100 in FIG. 1A, except that the light emitting device 600 of the present embodiment further includes a cap 610 on the cathode 180, and the patterned structure layer C supports between the cap 610 and the second insulating layer 160 to form a closing chamber B between the cap 610 and the cathode 180. Furthermore, an adhesive layer A may be optionally formed between the cap 610 and the patterned structure layer C.

Figure 7:
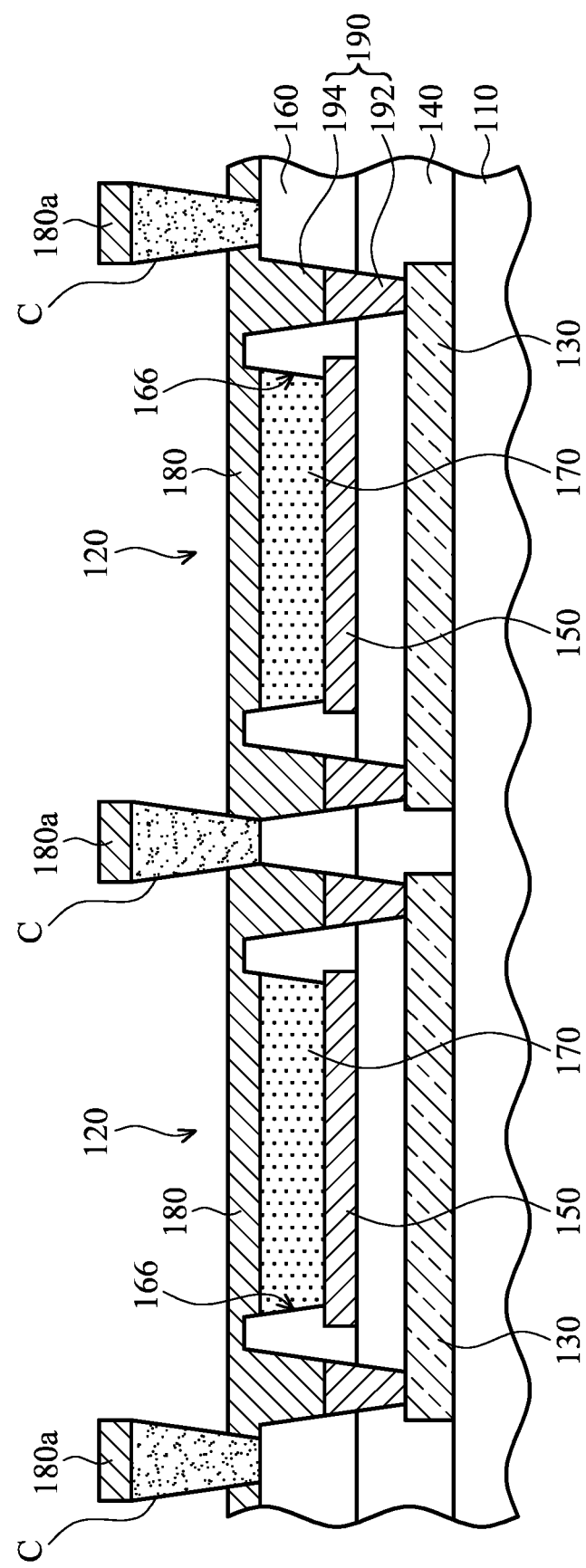
FIG. 7 is a cross-sectional view of a light emitting device according to an embodiment of the present disclosure.

FIG. 7 is a cross-sectional view of a light emitting device according to an embodiment of the present disclosure. Referring to FIG. 7, in the present embodiment, auxiliary electrodes 130 of a plurality of light emitting structures 120 are separated from each other and insulated from each other.

Figure 8:
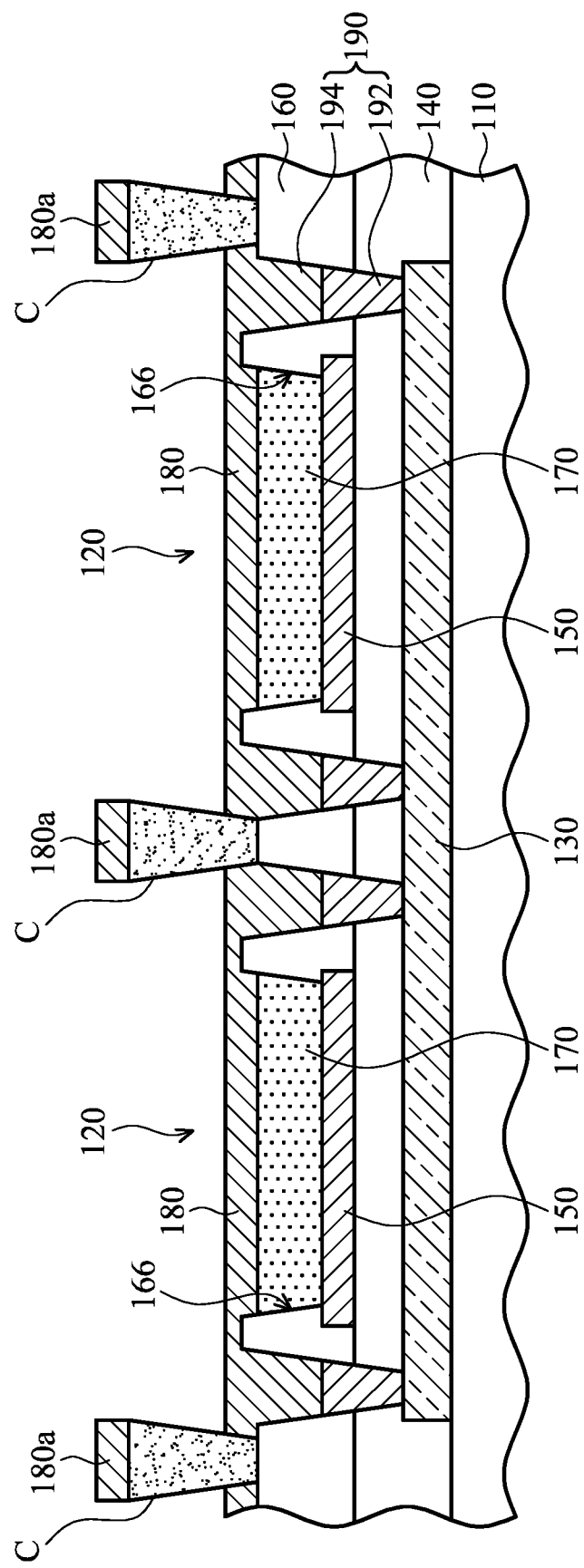
FIG. 8 is a cross-sectional view of a light emitting device according to another embodiment of the present disclosure.

FIG. 8 is a cross-sectional view of a light emitting device according to another embodiment of the present disclosure. Referring to FIG. 8, in another embodiment, auxiliary electrodes 130 of a plurality of light emitting structures 120 are connected to each other.

Figure 9:
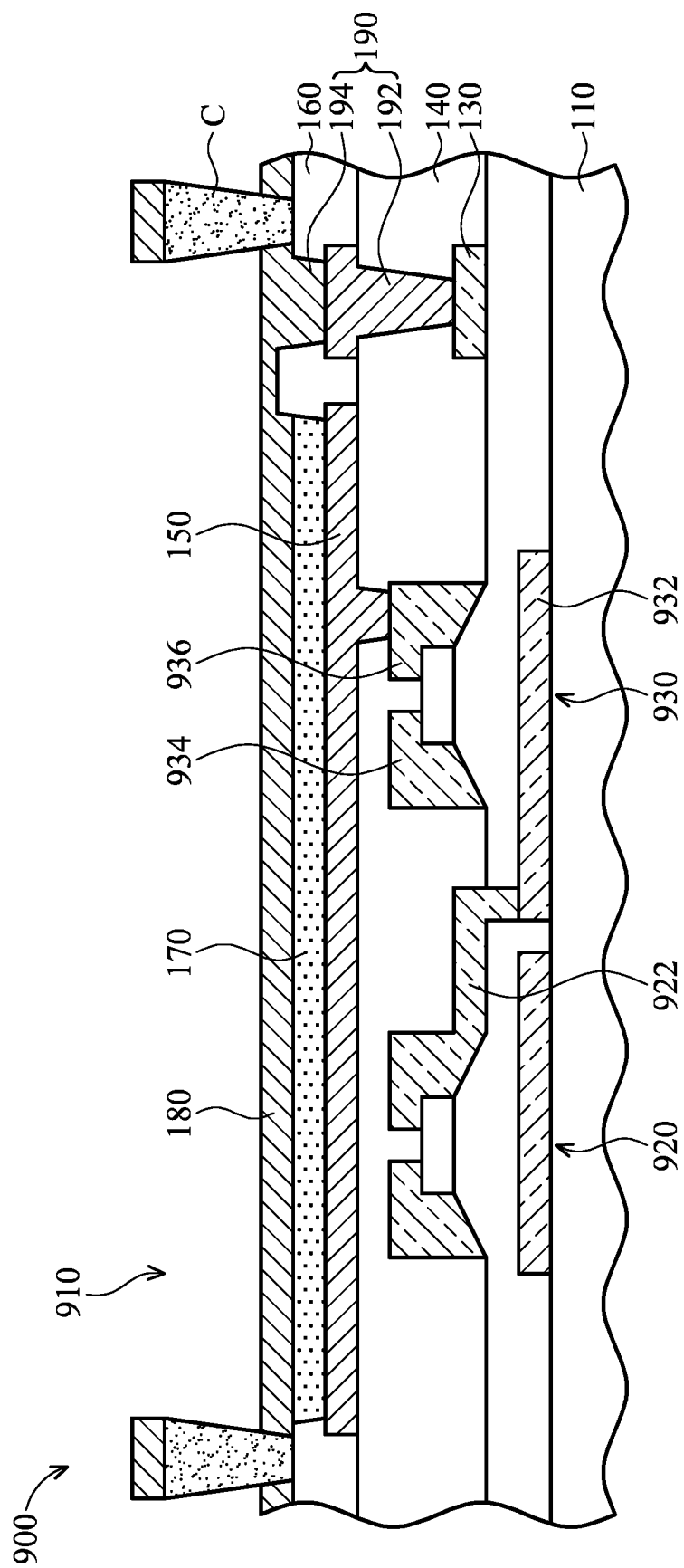
FIG. 9 is a cross-sectional view of a light emitting device according to an embodiment of the present disclosure.

FIG. 9 is a cross-sectional view of a light emitting device according to an embodiment of the present disclosure. Referring to FIG. 9, in the present embodiment, the light emitting device 900 is similar to the light emitting device 100 of FIG. 1A, except that the light emitting device 900 of the present embodiment is an active organic light emitting diode device, wherein the light emitting structure 910 further includes a first thin film transistor 920 and a second thin film transistor 930.

Specifically, the first thin film transistor 920 and the second thin film transistor 930 are disposed on the substrate 110. A third electrode (a source electrode or a drain electrode) 922 of the first thin film transistor 920 is electrically connected to a gate electrode 932 of the second thin film transistor 930. A fourth electrode 934 and a fifth electrode 936 are one and the other one of a source electrode and a drain electrode of the second thin film transistor 930. The fifth electrode 936 is electrically connected to the first electrode 150.

In light of the foregoing, in the light emitting structures of the present disclosure, the cathodes of the light emitting structures are isolated from each other by the patterned structure layer. The cathodes are electrically connected to the corresponding auxiliary electrodes, so in the present disclosure, the conventional large-sized common cathode is replaced by the isolated small-sized cathodes and the auxiliary electrodes. Therefore, the present disclosure may effectively reduce the size (i.e. the area) of each of the cathodes, which resolves the problems associated with voltage drop and the need for a large driving current due to the conventional cathode having a large area, thereby improving the performance of displays and the lifespan of electronic devices.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A light emitting device, comprising:
a substrate; and
a plurality of light emitting structures on the substrate, wherein each of the light emitting structures comprises:
an auxiliary electrode disposed on the substrate, wherein the auxiliary electrode is suitable to be used as a cathode;
a first insulating layer disposed on the substrate and covering the auxiliary electrode;
a first electrode disposed on the first insulating layer, wherein the first electrode is suitable to be used as an anode;
a second insulating layer disposed on the first insulating layer and having a first opening which exposes the first electrode;

a first organic light-emitting layer disposed in the first opening to connect the first electrode;

a cathode disposed on the first organic light-emitting layer;

at least a conductive structure passing through the first insulating layer and the second insulating layer and electrically connecting the cathode to the auxiliary electrode; and a patterned structure layer disposed on the second insulating layer and around the cathode, wherein a thickness of the patterned structure layer is larger than that of the cathode, and wherein the patterned structure is a closed structure to separate the cathodes of two light emitting structures from each other.

2. The light emitting device as claimed in claim 1, further comprising:

a conductive layer disposed on the patterned structure layer, wherein the conductive layer and the cathode are formed during the same deposition process.

3. The light emitting device as claimed in claim 1, wherein the auxiliary electrode is located directly below the first electrode.

4. The light emitting device as claimed in claim 1, wherein the first insulating layer has a first through hole, the second insulating layer has a second through hole connecting the first through hole, and the conductive structure has a first conductive plug disposed in the first through hole and a second conductive plug disposed in the second through hole.

5. The light emitting device as claimed in claim 4, wherein the first conductive plug and the first electrode are formed during the same deposition process, and the second conductive plug and the cathode are formed during the same deposition process.

6. The light emitting device as claimed in claim 4, further comprising:

a thick metal layer disposed in the second through hole, wherein the thick metal layer has a thickness larger than that of the cathode.

7. The light emitting device as claimed in claim 6, wherein the thick metal layer is disposed on the second conductive plug.

8. The light emitting device as claimed in claim 6, wherein the second conductive plug is disposed on the thick metal layer.

9. The light emitting device as claimed in claim 6, further comprising:

a conductive layer disposed on the patterned structure layer, wherein the conductive layer and the thick metal layer are formed during the same deposition process.

10. The light emitting device as claimed in claim 1, wherein the patterned structure layer is in an inverted trapezoid shape.

11. The light emitting device as claimed in claim 1, wherein the geometric of the patterned structure layer is square, rectangular, or circular.

12. The light emitting device as claimed in claim 1, wherein the light emitting structure further comprises:

a second electrode disposed on the first insulating layer and separated from the first electrode, wherein the second electrode is suitable to be used as an anode, and the second insulating layer further has a second opening which exposes the second electrode; and a second organic light-emitting layer disposed in the second opening to connect the second electrode, wherein the cathode is disposed on the second organic light-emitting layer, wherein a first light emitting unit comprises the first electrode, the first organic light-emitting layer, and the cathode, and a second light emitting unit comprises the second electrode, the second organic light-emitting layer, and the cathode.

13. The light emitting device as claimed in claim 1, further comprising:

a cap on the cathode, wherein the patterned structure layer supports between the cap and the second insulating layer to form a closing chamber between the cap and the cathode.

14. The light emitting device as claimed in claim 1, wherein the auxiliary electrodes of at least two of the light emitting structures are connected to each other.

15. The light emitting device as claimed in claim 1, wherein the auxiliary electrodes of at least two of the light emitting structures are electrically insulated from each other.

16. The light emitting device as claimed in claim 1, wherein the auxiliary electrode and the first electrode comprise a transparent conductive material.

17. The light emitting device as claimed in claim 16, wherein the cathode is a transparent film.

18. The light emitting device as claimed in claim 1, wherein the cathode is a transparent film.

19. The light emitting device as claimed in claim 18, wherein the first electrode comprises a high reflectivity material.

20. The light emitting device as claimed in claim 1, wherein the light emitting device is an active organic light emitting diode device.

21. The light emitting device as claimed in claim 20, further comprising:

a first thin film transistor on the substrate; and a second thin film transistor on the substrate, wherein the first thin film transistor has a third electrode electrically connected to a gate electrode of the second thin film transistor, the third electrode is a source electrode or a drain electrode of the first thin film transistor, the second thin film transistor has a fourth electrode and a fifth electrode, the fourth electrode and the fifth electrode are one and the other one of a source electrode and a drain electrode of the second thin film transistor, and the fifth electrode is electrically connected to the first electrode.

* * * * *